(12) United States Patent
Lee et al.

(10) Patent No.: US 11,088,676 B1
(45) Date of Patent: Aug. 10, 2021

(54) CALIBRATION CIRCUIT AND TRANSMITTER INCLUDING THE SAME

(71) Applicants: SK hynix Inc., Icheon (KR); Seoul National University R&DB Foundation, Seoul (KR)

(72) Inventors: Sangyoon Lee, Seoul (KR); Jaekwang Yun, Incheon (KR); Suhwan Kim, Seoul (KR)

(73) Assignees: SK hynix Inc., Icheon (KR); Seoul National University R&DB Foundation, Icheon (KR)

( * ) Notice: Subject to any disclaimer, the term of this patent is extended or adjusted under 35 U.S.C. 154(b) by 0 days.

(21) Appl. No.: 17/166,697

(22) Filed: Feb. 3, 2021

(30) Foreign Application Priority Data

Jul. 24, 2020 (KR) .......................... 10-2020-0092086

(51) Int. Cl.
*H03K 3/012* (2006.01)
*H03K 5/24* (2006.01)
*H03K 21/02* (2006.01)

(52) U.S. Cl.
CPC .............. *H03K 3/012* (2013.01); *H03K 5/24* (2013.01); *H03K 21/02* (2013.01)

(58) Field of Classification Search
CPC ........... H03K 3/012; H03K 5/24; H03K 21/02
USPC ................................................. 327/108, 109
See application file for complete search history.

(56) References Cited

U.S. PATENT DOCUMENTS

| 7,307,485 | B1 | 12/2007 | Snyder et al. | |
| 7,990,174 | B2 | 8/2011 | Park | |
| 11,005,376 | B2* | 5/2021 | Chen | H02M 3/33507 |
| 2011/0187345 | A1* | 8/2011 | Karnik | G01R 35/00 324/74 |
| 2011/0267900 | A1* | 11/2011 | Kim | G11C 7/1084 365/189.07 |
| 2012/0099383 | A1* | 4/2012 | Kim | G11C 7/1057 365/189.02 |

FOREIGN PATENT DOCUMENTS

KR       10-1846562        4/2018

\* cited by examiner

*Primary Examiner* — William Hernandez

(57) ABSTRACT

A calibration circuit includes an oscillator configured to generate an oscillation signal according to a control voltage; a counter configured to generate a count value according to the oscillation signal; and a control circuit configured to control a pull-up driver and a pull-down driver commonly coupled to an output node according to the count value, wherein the control circuit compares a reference count value of the counter by providing a reference voltage as the control voltage for a unit control period with a count value of the counter by providing an output voltage of the output node as the control voltage for a unit control period, and controls a pull-up control signal that adjusts turn-on impedance of the pull-up driver and a pull-down control signal that adjusts turn-on impedance of the pull-down driver.

18 Claims, 5 Drawing Sheets

<Prior Art>

CALIBRATION CIRCUIT AND TRANSMITTER INCLUDING THE SAME

CROSS-REFERENCE TO RELATED APPLICATION

The present application claims priority under 35 U.S.C. § 119(a) to Korean Patent Application No. 10-2020-0092086, filed on Jul. 24, 2020, which are incorporated herein by reference in its entirety.

BACKGROUND

1. Technical Field

Various embodiments relate to a calibration circuit and a transmitter including the calibration circuit, and more specifically, to a calibration circuit including an oscillator and a transmitter including the calibration circuit.

2. Related Art

Output impedance of a transmitter is adjusted to be equal to characteristic impedance during a calibration operation.

FIG. 1 shows a conventional transmitter 10.

The conventional transmitter 10 includes a pull-up driver 1 and a pull-down driver 2 that are commonly coupled to an output node No.

The output node No is coupled to a channel through which a signal is transmitted.

In FIG. 1, the other elements except for the pull-up driver 1 and the pull-down driver 2 may be included in a calibration circuit.

The calibration circuit adjusts the pull-up impedance of the pull-up driver 1 and the pull-down impedance of the pull-down driver 2 to be equal to the characteristic impedance of the channel.

Referring to FIG. 1, the calibration circuit includes a replica pull-up driver 3 that has a configuration substantially identical to that of the pull-up driver 1.

The replica pull-up driver 3 is coupled to a reference resistor RZ through a replica output node Nr, and impedance of the reference resistor RZ is set equal to the characteristic impedance.

Turn-on impedance of the pull-up driver 1 and the replica pull-up driver 3 is controlled according to a pull-up control signal PU, and turn-on impedance of the pull-down driver 2 is controlled according to a pull-down control signal PD.

Techniques for controlling the turn-on impedance of a driver according to a control signal are well known to those skilled in the art. Therefore, the detailed description therefor is omitted herein.

A first counter 21 increases or decreases the pull-up control signal PU according to a first comparison signal CMP1, and the second counter 22 increases or decreases the pull-down control signal PD according to a second comparison signal CMP2.

A first comparator 31 compares a reference voltage VREF and a replica output voltage VZQ and outputs the first comparison signal CMP1 having a high or low level according to a comparison result.

At this time, a reference voltage generator 40 outputs the reference voltage VREF having a ½ level of a power supply voltage.

The pull-up impedance of the pull-up driver 1 and the replica pull-up driver 3 should be equal to the characteristic impedance, and in this case, the replica output voltage VZQ should preferably be equal to the ½ level of the power supply voltage.

A second comparator 32 compares the reference voltage VREF and an output voltage VZQN and outputs the second comparison signal CMP2 having a high or low level according to a comparison result.

When the calibration for the pull-up driver 1 is finished, the output impedance of the pull-up driver 1 becomes equal to the characteristic impedance.

The pull-down impedance of the pull-down driver 2 should be equal to the characteristic impedance, in which case the output voltage VZQN should have the ½ level of the power supply voltage.

The first comparator 31 and the second comparator 32 output their comparison results in synchronization with a first clock signal CLK1, and the first counter 21 and the second counter 22 update the pull-up control signal PU and the pull-down control signal PD in synchronization with a second clock signal CLK2 having a different phase from the first clock signal CLK1. The first counter 21 and the second counter 22 are reset in response to a reset control signals RESET.

As described above, the conventional calibration circuit uses the first comparator 31 and the second comparator 32 to perform a calibration operation. The pull-up control signal PU and the pull-down control signal PD may not converge to optimal values because of offsets or mismatches inherent in the first comparator 31 and the second comparator 32.

SUMMARY

In accordance with an embodiment of the present disclosure, a calibration circuit may include an oscillator configured to generate an oscillation signal according to a control voltage; a counter configured to generate a count value by counting a frequency of the oscillation signal; and a control circuit configured to control a pull-up driver and a pull-down driver that are commonly coupled to an output node based on the count value, wherein the control circuit compares a reference count value of the counter with a first count value of the counter, and then determines, based on a comparison result, a pull-up control signal, a pull-down control signal, or both, the pull-up control signal adjusting turn-on impedance of the pull-up driver and the pull-down control signal adjusting turn-on impedance of the pull-down driver, the reference count value being determined by providing the oscillator with a reference voltage as the control voltage, the first count value being determined by providing the oscillator with an output voltage of the output node as the control voltage.

In accordance with an embodiment of the present disclosure, a transmitter may include a pull-up driver and a pull-down driver that are commonly coupled to a channel at an output node; an oscillator configured to generate an oscillation signal according to a control voltage; a counter configured to generate a count value by counting a frequency of the oscillation signal; and a control circuit configured to control the pull-up driver and the pull-down driver based on the count value, wherein the control circuit compares a reference count value of the counter with a first count value of the counter, and then determines, based on a comparison result, a pull-up control signal, a pull-down control signal, or both, the pull-up control signal adjusting turn-on impedance of the pull-up driver and the pull-down control signal adjusting turn-on impedance of the pull-down driver, the reference count value being determined by providing the oscillator with a reference voltage as the control voltage the first count value being determined by providing the oscillator with an output voltage of the output node as the control voltage.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
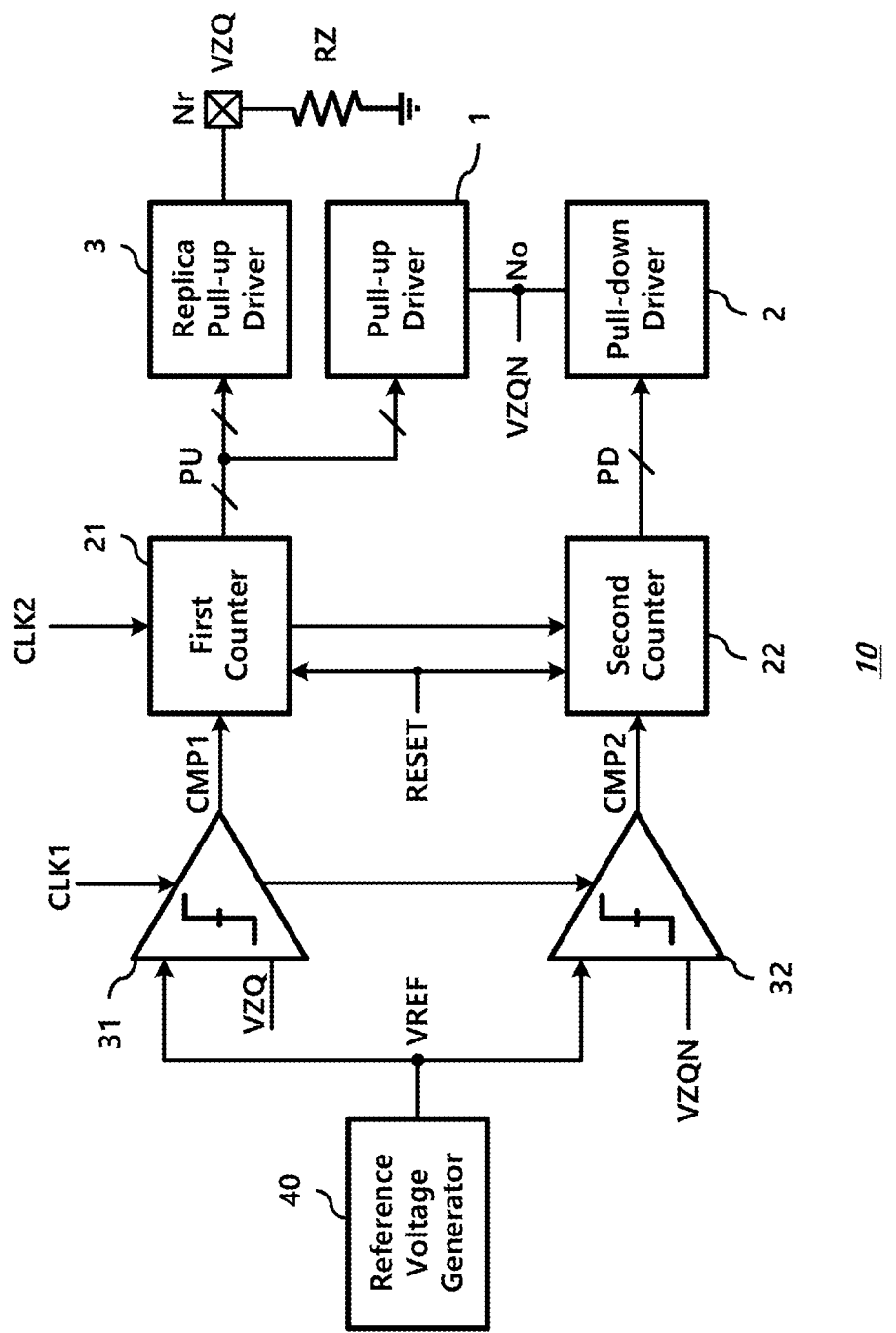
FIG. 1 is a block diagram illustrating a conventional transmitter.
Figure 2:
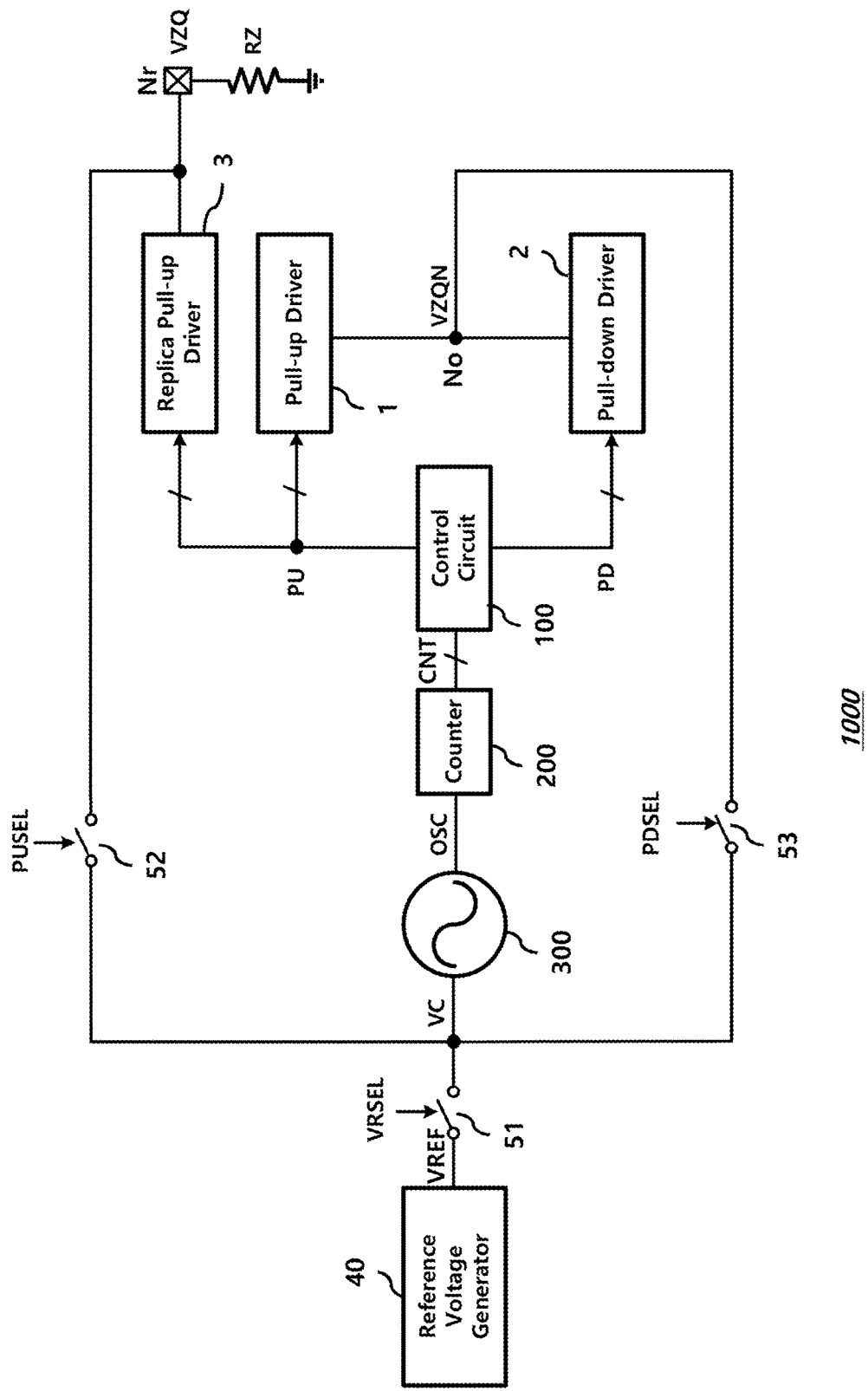
FIG. 2 is a block diagram illustrating a transmitter according to an embodiment of the present disclosure.

FIG. 2 illustrates a transmitter 1000 according to an embodiment of the present disclosure.

The transmitter 1000 includes a pull-up driver 1 and a pull-down driver 2 that are commonly coupled to an output node No.

The output node No is coupled to a channel through which a signal is transmitted. The channel may be formed with a transmission line.

In FIG. 2, the other elements except for the pull-up driver 1 and the pull-down driver 2 may be included in a calibration circuit.

The calibration circuit adjusts the pull-up impedance of the pull-up driver 1 and the pull-down impedance of the pull-down driver 2 to be equal to characteristic impedance of the channel. The calibration circuit includes a replica pull-up driver 3 that has a configuration substantially identical to that of the pull-up driver 1.

The replica pull-up driver 3 is coupled to a reference resistor RZ through a replica output node Nr, and impedance of the reference resistor RZ is set equal to the characteristic impedance of the channel.

The turn-on impedance of the pull-up driver 1 and the replica pull-up driver 3 is controlled according to a pull-up control signal PU, and the turn-on impedance of the pull-down driver 2 is controlled according to a pull-down control signal PD.

In this embodiment, it is assumed that a power supply voltage is applied to the pull-up driver 1 and the replica pull-up driver 3 and that the pull-down driver 2 is grounded.

The circuit for controlling the turn-on impedance of the driver according to the control signal is well known to those of ordinary skill in the art, and thus the detailed description therefor is omitted herein.

A control circuit 100 controls a calibration operation and generates the pull-up control signal PU and the pull-down control signal PD.

The control circuit 100 generates the pull-up control signal PU and the pull-down control signal PD based on a count value CNT provided by a counter 200.

The counter 200 provides the count value CNT by performing a counting operation on an oscillation signal OSC provided by an oscillator 300. During the counting operation, the counter 200 counts a frequency of the oscillation signal OSC.

The oscillator 300 provides the oscillation signal OSC by performing an oscillation operation according to a control voltage VC.

During the calibration operation, one of a reference voltage VREF, a replica output voltage VZQ, and an output voltage VZQN is provided to the oscillator 300 as the control voltage VC.

The reference voltage VREF is provided by a reference voltage generator 40.

The replica output voltage VZQ is a voltage output from the replica pull-up driver 3 through the replica output node Nr.

The output voltage VZQN is a voltage on the output node No to which the pull-up driver 1 and the pull-down driver 2 are commonly coupled.

The calibration circuit includes a first switch 51 that provides the reference voltage VREF to the oscillator 300 in response to a reference voltage selection signal VRSEL, a second switch 52 that provides the replica output voltage VZQ in response to a pull-up selection signal PUSEL, and a third switch 53 that provides the output voltage VZQN to the oscillator 300 in response to a pull-down selection signal PDSEL.

Hereinafter, a calibration operation of the control circuit 100 will be described with reference to FIGS. 4 and 5.

Figure 4:
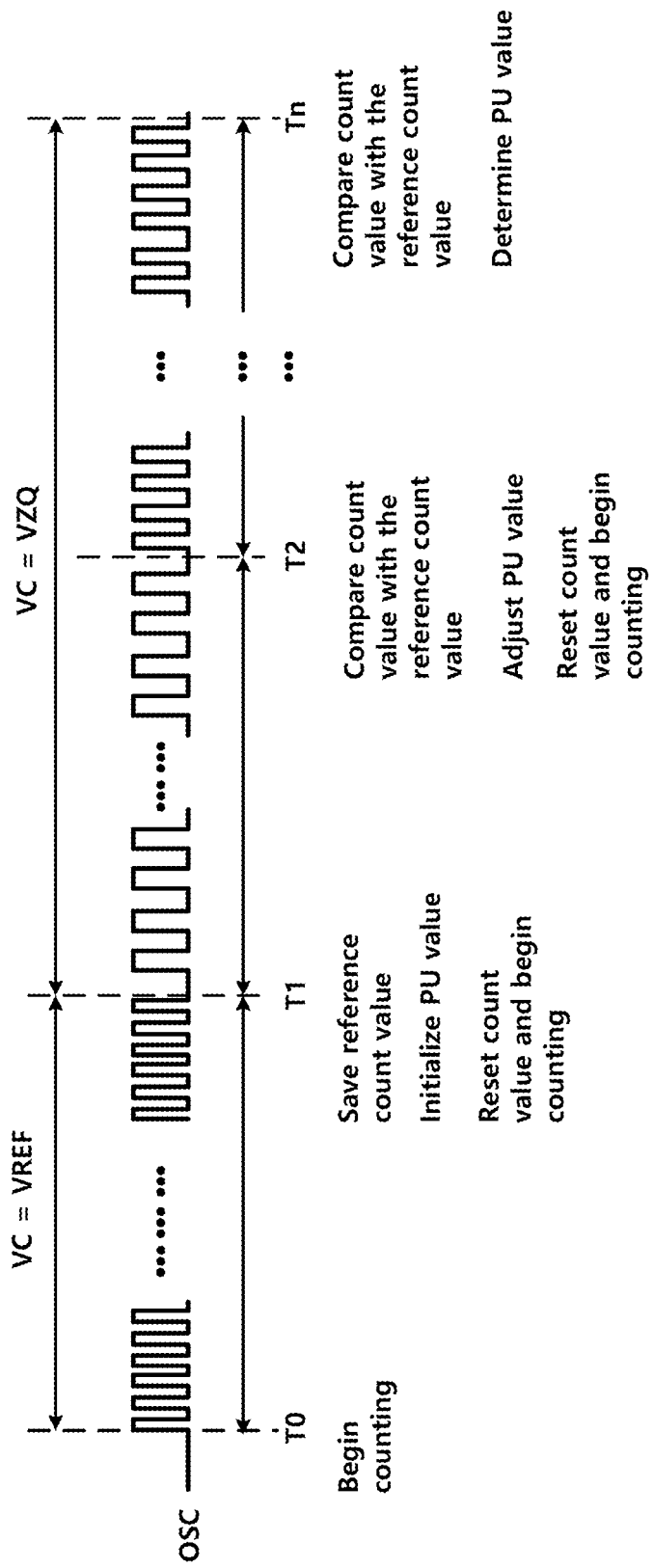
FIGS. 4 and 5 are diagrams illustrating a calibration operation according to an embodiment of the present disclosure.
Figure 5:
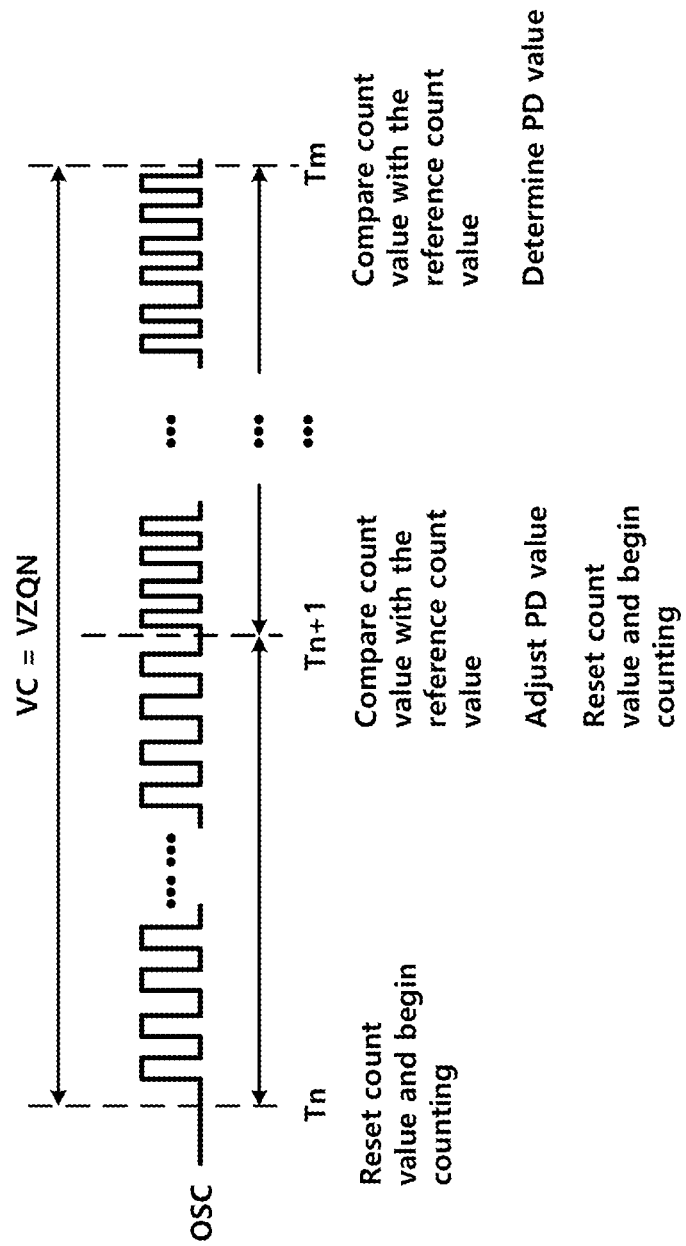

In FIGS. 4 and 5, a time period between Ti−1 and Ti ($1 \leq i \leq m$) corresponds to a unit control period which is kept constant, and the control circuit 100 controls the calibration operation according to the unit control period.

The calibration operation includes a pull-up calibration operation for determining the pull-up control signal PU and a pull-down calibration operation for determining the pull-down control signal PD.

In the embodiment of FIG. 2, after performing the pull-up calibration operation, the pull-down calibration operation is performed.

In a time period between T0 and T1, the control voltage VC is set as the reference voltage VREF, in a time period between T1 and Tn, the control voltage VC is set as the replica output voltage VZQ, and in a time period between Tn and Tm, the control voltage VC is set as the output voltage VZQN.

At T0, the counter 200 starts a counting operation. Through the counting operation based on the reference voltage VREF, a reference count value is determined and stored, and a value of the pull-up control signal PU is initialized. After the reference count value is saved, a count value CNT of the counter 200 is reset and the counting operation starts again at T1.

Thereafter, the count value CNT resulting from the counting operation is compared with the reference count value, and the value of the pull-up control signal PU is adjusted according to a comparison result at T2.

In this embodiment, it is assumed that the frequency of the oscillation signal OSC output from the oscillator 300 increases when a level of the control voltage VC increases.

In this case, if the count value CNT is greater than the reference count value, it means that the replica output voltage VZQ has a higher level than the reference voltage VREF, and thus the pull-up control signal PU is set in a direction for increasing the turn-on impedance of the pull-up driver 1.

Conversely, if the count value CNT is smaller than the reference count value, it means that the replica output voltage VZQ has a lower level than the reference voltage VREF, and thus the pull-up control signal PU is set in a direction for decreasing the turn-on impedance of the pull-up driver 1.

At each of T2 to Tn, the count value CNT is reset, the counting operation starts again, and the operation performed in the time period between T1 and T2 is repeated.

At Tn, the count value CNT is compared with the reference count value, and accordingly, the value of the pull-up control signal PU is determined.

Conditions for determining the value of the pull-up control signal PU may be variously designed according to exemplary embodiments. For example, if a difference between the reference count value and the count value CNT is less than a predetermined threshold value, the value of the pull-up control signal PU may be determined.

After the value of the pull-up control signal PU is determined, the pull-down calibration operation proceeds.

As shown in FIG. 5, after initializing a value of the pull-down control signal PD at Tn, the count value CNT is reset and the counting operation begins.

At Tn+1, the count value CNT is compared with the reference count value, and the value of the pull-down control signal PD is adjusted according to a comparison result.

If the count value CNT is greater than the reference count value, it means that the output voltage VZQN has a higher level than the reference voltage VREF, and thus the pull-down control signal PD is set in a direction for decreasing the turn-on impedance of the pull-down driver 2.

Conversely, if the count value CNT is less than the reference count value, it means that the output voltage VZQN has a lower level than the reference voltage VREF, and thus the pull-down control signal PD is set in a direction for increasing the turn-on impedance of the pull-down driver 2.

After that, at each of Tn+1 to Tm, the count value CNT is reset, the counting operation starts again and the operation performed in the time period between Tn and Tn+1 is repeated.

At Tm, the count value CNT is compared with the reference count value, and the value of the pull-down control signal PD is determined according to a comparison result.

Conditions for determining the value of the pull-down control signal PD may be variously designed according to exemplary embodiments. For example, if the difference between the reference count value and the count value CNT is less than a predetermined threshold value, the value of the pull-down control signal PD may be determined.

Figure 3:
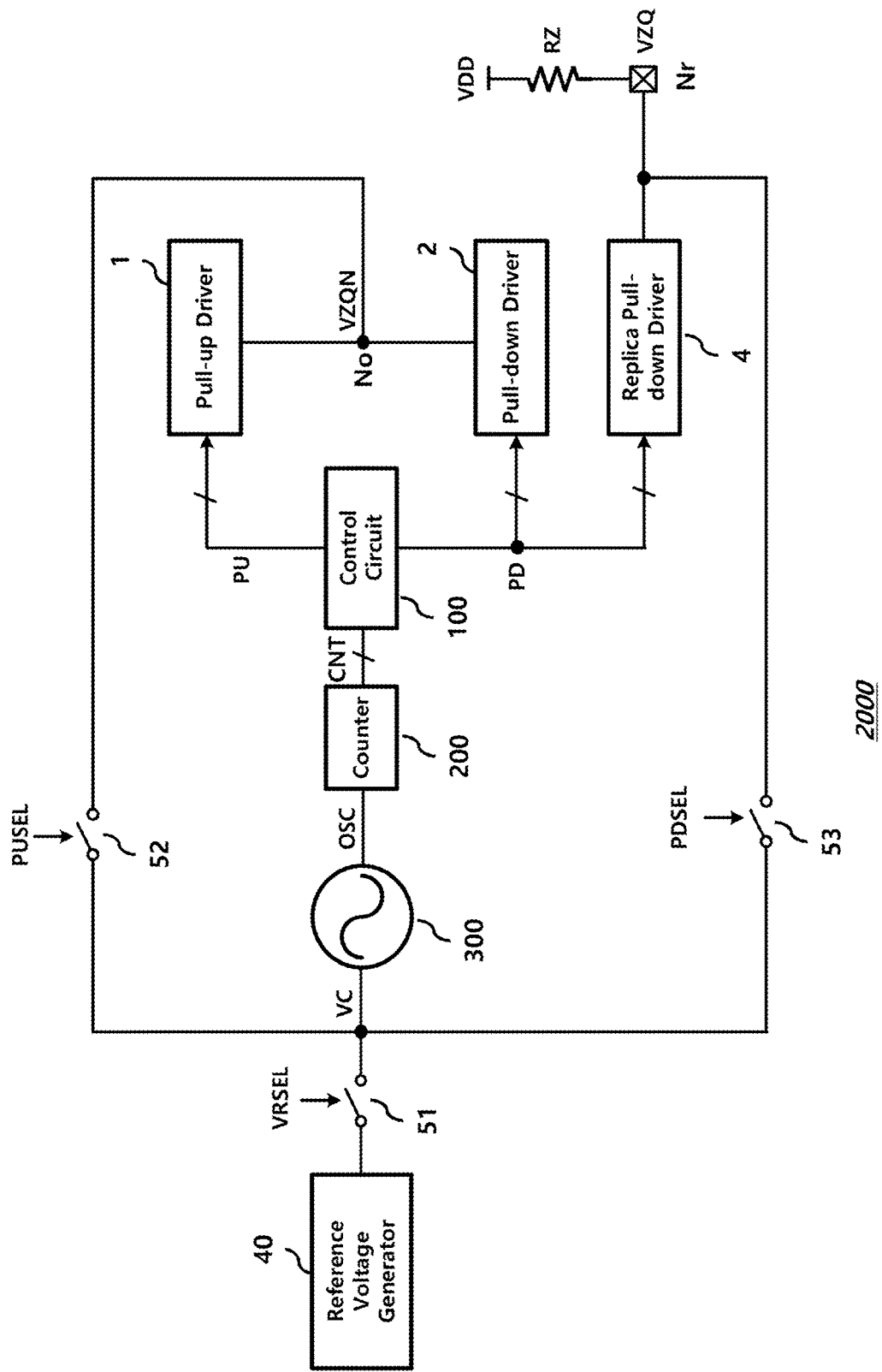
FIG. 3 is a block diagram illustrating a transmitter according to another embodiment of the present disclosure.

FIG. 3 illustrates a transmitter 2000 according to another embodiment of the present disclosure.

Unlike the embodiment of FIG. 2, the embodiment of FIG. 3 includes a replica pull-down driver 4 instead of the replica pull-up driver 3.

In addition, the replica output node Nr is coupled to an output terminal of the replica pull-down driver 4, and the reference resistor RZ is coupled between the replica output node Nr and a power supply voltage VDD.

In the embodiment of FIG. 3, a pull-down calibration operation is first performed using the replica pull-down driver 4, and then a pull-up calibration operation is performed using the pull-up driver 1.

In addition, the second switch 52 provides the output voltage VZQN to the oscillator 300 in response to the pull-up selection signal PUSEL, and the third switch 53 provides the replica output voltage VZQ to the oscillator 300 in response to the pull-down selection signal PDSEL.

A reference count value is set by counting a frequency of the oscillation signal OSC output from the oscillator 300 when the reference voltage VREF is provided to the oscillator 300. After that, a value of the pull-down control signal PD is determined by performing the pull-down calibration operation based on the replica output voltage VZQ provided to the oscillator 300. Subsequently, a value of the pull-up control signal PU is determined by performing the pull-up calibration operation based on the output voltage VZQN provided to the oscillator 300. These operations are similar to the operations described with reference to FIGS. 4 and 5.

Therefore, the functions and calibration operations of the control circuit 100, the counter 200, the oscillator 300, and the reference voltage generator 40 in the embodiment of FIG. 3 are easily understood from the above-described embodiment described with reference to FIG. 2, so a detailed description therefor will be omitted.

Although various embodiments have been described for illustrative purposes, various changes and modifications may be possible.

What is claimed is:

1. A calibration circuit, comprising:
   an oscillator configured to generate an oscillation signal according to a control voltage;
   a counter configured to generate a count value by counting a frequency of the oscillation signal; and
   a control circuit configured to control a pull-up driver and a pull-down driver that are commonly coupled to an output node based on the count value,
   wherein the control circuit compares a reference count value of the counter with a first count value of the counter, and then determines, based on a comparison result, a pull-up control signal, a pull-down control signal, or both, the pull-up control signal adjusting turn-on impedance of the pull-up driver and the pull-down control signal adjusting turn-on impedance of the pull-down driver, the reference count value being determined by providing the oscillator with a reference voltage as the control voltage, the first count value being determined by providing the oscillator with an output voltage of the output node as the control voltage.

2. The calibration circuit of claim 1, further comprising:
   a replica pull-up driver that replicates the pull-up driver; and
   a reference resistor coupled to a replica output node of the replica pull-up driver,
   wherein the control circuit controls turn-on impedance of the replica pull-up driver using the pull-up control signal.

3. The calibration circuit of claim 2, wherein the control circuit compares the reference count value with a second count value of the counter by providing a replica output voltage of the replica output node as the control voltage, and then determines, based on a comparison result, the pull-up control signal.

4. The calibration circuit of claim 3, wherein the control circuit determines the pull-down control signal after the pull-up control signal is determined.

5. The calibration circuit of claim 3, wherein the control circuit determines the pull-up control signal when a difference between the reference count value and the second count value is less than a first predetermined threshold value, and determines the pull-down control signal when a difference between the reference count value and the first count value is less than a second predetermined threshold value.

6. The calibration circuit of claim 1, further comprising:
a replica pull-down driver that replicates the pull-down driver; and
a reference resistor coupled to a replica output node of the replica pull-down driver,
wherein the control circuit controls turn-on impedance of the replica pull-down driver using the pull-down control signal.

7. The calibration circuit of claim 6, wherein the control circuit compares the reference count value with a second count value of the counter by providing a replica output voltage of the replica output node as the control voltage, and then determines, based on a comparison result, the pull-down control signal.

8. The calibration circuit of claim 7, wherein the control circuit determines the pull-up control signal after the pull-down control signal is determined.

9. The calibration circuit of claim 7, wherein the control circuit determines the pull-down control signal when a difference between the reference count value and the second count value is less than a first predetermined threshold value, and determines the pull-up control signal when a difference between the reference count value and the first count value is less than a second predetermined threshold value.

10. A transmitter, comprising:
a pull-up driver and a pull-down driver that are commonly coupled to a channel at an output node;
an oscillator configured to generate an oscillation signal according to a control voltage;
a counter configured to generate a count value by counting a frequency of the oscillation signal; and
a control circuit configured to control the pull-up driver and the pull-down driver based on the count value,
wherein the control circuit compares a reference count value of the counter with a first count value of the counter, and then determines, based on a comparison result, a pull-up control signal, a pull-down control signal, or both, the pull-up control signal adjusting turn-on impedance of the pull-up driver and the pull-down control signal adjusting turn-on impedance of the pull-down driver, the reference count value being determined by providing the oscillator with a reference voltage as the control voltage, the first count value being determined by providing the oscillator with an output voltage of the output node as the control voltage.

11. The transmitter of claim 10, further comprising:
a replica pull-up driver that replicates the pull-up driver; and
a reference resistor coupled to a replica output node of the replica pull-up driver,
wherein the control circuit controls turn-on impedance of the replica pull-up driver using the pull-up control signal.

12. The transmitter of claim 11, wherein the control circuit compares the reference count value with a second count value of the counter by providing a replica output voltage of the replica output node as the control voltage, and then determines, based on a comparison result, the pull-up control signal.

13. The transmitter of claim 12, wherein the control circuit determines the pull-down control signal after the pull-up control signal is determined.

14. The transmitter circuit of claim 12, wherein the control circuit determines the pull-up control signal when a difference between the reference count value and the second count value is less than a first predetermined threshold value, and determines the pull-down control signal when a difference between the reference count value and the first count value is less than a second predetermined threshold value.

15. The transmitter of claim 10, further comprising:
a replica pull-down driver that replicates the pull-down driver; and
a reference resistor coupled to a replica output node of the replica pull-down driver,
wherein the control circuit controls turn-on impedance of the replica pull-down driver using the pull-down control signal.

16. The transmitter of claim 15, wherein the control circuit compares the reference count value with a second count value of the counter by providing a replica output voltage of the replica output node as the control voltage, and then determines, based on a comparison result, the pull-down control signal.

17. The transmitter of claim 16, wherein the control circuit determines the pull-up control signal after the pull-down control signal is determined.

18. The transmitter circuit of claim 16, wherein the control circuit determines the pull-down control signal when a difference between the reference count value and the second count value is less than a first predetermined threshold value, and determines the pull-up control signal when a difference between the reference count value and the first count value is less than a second predetermined threshold value.

* * * * *